United States Patent
Karrer

(10) Patent No.: US 9,018,537 B2
(45) Date of Patent: Apr. 28, 2015

(54) SURFACE-MOUNTABLE ELECTRONIC DEVICE

(75) Inventor: Heinrich Karrer, Regau (AT)

(73) Assignee: Vishay Semiconductor GmbH, Heilbronn (DE)

( * ) Notice: Subject to any disclaimer, the term of this patent is extended or adjusted under 35 U.S.C. 154(b) by 1293 days.

(21) Appl. No.: 12/142,099

(22) Filed: Jun. 19, 2008

(65) Prior Publication Data

US 2009/0266593 A1 Oct. 29, 2009

(30) Foreign Application Priority Data

Apr. 24, 2008 (DE) .................... 20 2008 005 708 U

(51) Int. Cl.
| | |
|---|---|
| H05K 1/16 | (2006.01) |
| H01G 2/06 | (2006.01) |
| H01L 23/50 | (2006.01) |
| H05K 3/34 | (2006.01) |
| H01L 23/498 | (2006.01) |

(52) U.S. Cl.
CPC .......... *H01G 2/065* (2013.01); *H01L 23/49805* (2013.01); *H01L 23/49838* (2013.01); *H01L 23/50* (2013.01); *H05K 3/3442* (2013.01); *H05K 2201/09381* (2013.01); *H05K 2201/10636* (2013.01); *H01L 2924/0002* (2013.01)

(58) Field of Classification Search
USPC ............... 174/260, 250, 520; 361/303, 306.1, 361/309, 760, 766, 774; 257/667, 678, 690, 257/700, 718
See application file for complete search history.

(56) References Cited

U.S. PATENT DOCUMENTS

| | | | | |
|---|---|---|---|---|
| 4,734,819 | A | * | 3/1988 | Hernandez et al. ........ 361/306.2 |
| 5,249,354 | A | * | 10/1993 | Richman .................... 29/827 |
| 5,339,218 | A | * | 8/1994 | Veeck ....................... 361/707 |
| 5,459,642 | A | * | 10/1995 | Stoddard .................... 361/774 |
| 5,740,010 | A | * | 4/1998 | Devoe et al. ................ 361/321.1 |
| 5,894,185 | A | * | 4/1999 | Asada et al. ................. 310/368 |
| 5,901,046 | A | * | 5/1999 | Ohta et al. .................. 361/760 |
| 6,011,684 | A | * | 1/2000 | Devoe et al. ................ 361/321.1 |
| 6,456,481 | B1 | * | 9/2002 | Stevenson ................... 361/302 |

(Continued)

FOREIGN PATENT DOCUMENTS

| | | |
|---|---|---|
| DE | 20 31 285 A | 1/1971 |
| DE | 10301512 A1 | 10/2003 |

(Continued)

OTHER PUBLICATIONS

JEDEC Standard MO-236, Plastic Ultra and Super Thin Small Outline, Non-leaded Package Family (issue B, Mar. 2007).

(Continued)

*Primary Examiner* — Xiaoliang Chen
(74) *Attorney, Agent, or Firm* — Gifford, Krass, Sprinkle, Anderson & Citkowski, P.C.

(57) ABSTRACT

A surface-mountable electronic device free of leads has a plurality of solderable connection surfaces at its lower side, with at least one of the connection surfaces having a rectangular portion. The outline of this rectangular portion corresponds to a connection surface of the JEDEC Standard MO-236 or of any other standard according to which the respective connection surface should not extend directly up to a side edge of the lower device side. The at least one connection surface furthermore has an extension section which extends, starting from the rectangular portion, in the direction of a side edge of the lower side of the device.

1 Claim, 2 Drawing Sheets

(56) References Cited

U.S. PATENT DOCUMENTS

| | | | |
|---|---|---|---|
| 6,483,692 B2 * | 11/2002 | Figueroa et al. | 361/308.1 |
| 6,713,849 B2 * | 3/2004 | Hasebe et al. | 257/667 |
| 6,753,603 B2 * | 6/2004 | Segi et al. | 257/718 |
| 6,788,545 B2 * | 9/2004 | Nakayama | 361/752 |
| 6,794,762 B2 * | 9/2004 | Ikegami et al. | 257/787 |
| 6,870,256 B2 * | 3/2005 | Aoki et al. | 257/700 |
| 6,882,521 B2 * | 4/2005 | Tsutsui et al. | 361/523 |
| 6,906,417 B2 * | 6/2005 | Jiang et al. | 257/738 |
| 7,139,160 B2 * | 11/2006 | Hidaka et al. | 361/301.3 |
| 7,180,718 B2 * | 2/2007 | Anthony et al. | 361/118 |
| 7,271,995 B2 * | 9/2007 | Edson et al. | 361/540 |
| 7,423,332 B2 * | 9/2008 | Gerbsch et al. | 257/678 |
| 7,656,647 B2 * | 2/2010 | Edson et al. | 361/540 |
| 2001/0040286 A1 * | 11/2001 | Fujimoto et al. | 257/692 |
| 2002/0075190 A1 * | 6/2002 | Ghosh et al. | 343/702 |
| 2004/0043599 A1 * | 3/2004 | Takeshima | 438/622 |
| 2004/0103530 A1 * | 6/2004 | Adachi et al. | 29/854 |
| 2005/0056903 A1 * | 3/2005 | Yamamoto et al. | 257/433 |
| 2005/0088805 A1 * | 4/2005 | Edson et al. | 361/529 |
| 2006/0087388 A1 * | 4/2006 | Kawai et al. | 333/219 |
| 2006/0202764 A1 * | 9/2006 | Fukuda et al. | 330/296 |
| 2007/0210392 A1 * | 9/2007 | Sakakibara et al. | 257/414 |
| 2007/0229177 A1 * | 10/2007 | Moriya | 331/158 |
| 2007/0262328 A1 * | 11/2007 | Bando | 257/79 |
| 2007/0284735 A1 * | 12/2007 | Tanida et al. | 257/731 |
| 2008/0062617 A1 * | 3/2008 | Edson et al. | 361/529 |
| 2008/0165468 A1 * | 7/2008 | Berolini et al. | 361/306.3 |
| 2009/0289342 A1 * | 11/2009 | Kasuya et al. | 257/690 |

FOREIGN PATENT DOCUMENTS

| | | |
|---|---|---|
| DE | 103 06 557 A1 | 2/2004 |
| DE | 10 2005 004 160 A1 | 8/2006 |
| DE | 10 2005 027 356 B4 | 12/2006 |
| EP | 1 089 335 A1 | 4/2001 |

OTHER PUBLICATIONS

Vishay Semiconductors, Low Capacitance ESD Protection Diodes for Hight-Speed Data Interfaces, GL05-HT3 to GL24-HT3, Rev. 1.7, Apr. 29, 2005.

* cited by examiner

SURFACE-MOUNTABLE ELECTRONIC DEVICE

CROSS-REFERENCE TO RELATED APPLICATIONS

This application claims priority of German Patent Application No. DE 20 2008 005 708.6 filed Apr. 24, 2008.

FIELD OF THE INVENTION

The invention relates to a surface-mountable electronic device (or a "surface-mounted device", SMD). Such a device has at least one active or passive component (e.g. a protective diode, a light emitting diode, a resistor, a capacitor, etc.) within a housing.

BACKGROUND OF THE INVENTION

Such a device is typically electrically conductively connected to a printed circuit board (PCB). For this purpose, a surface-mountable device, however, does not have any leads which project out of the housing of the device or protrude beyond the housing to be connected to the printed circuit board in accordance with the principle of through hole installation. Instead, a surface-mountable device has a plurality of solderable connection surfaces by means of which the device is soldered to the printed circuit board. For tins purpose, a corresponding arrangement of contacting surfaces is provided at the printed circuit board. The contacting surfaces are printed with a solder paste, for example by means of screen printing/stencil printing. After the mounting of the printed circuit board with a plurality of devices, they are soldered to the contacting surfaces of the printed circuit board in the so-called reflow process, It is alternatively also known first to adhesively bond the surface-mountable devices onto the printed circuit board and finally to solder them in the so-called wave bath or splash bath.

A particularly advantageous type of surface-mountable devices without leads has a plurality of solderable connection surfaces at its lower side (i.e. at the bottom side of the device), with at least one of the connection surfaces (typically each of the connection surfaces) being formed by a rectangular portion. The arrangement of the connection surfaces at the lower side of the device is naturally exactly defined so that a corresponding arrangement of contacting surfaces can be provided at the associated printed circuit board. Different variants of such arrangements of connection surfaces at the lower device side are in particular known from the standard MO-236 (Issue B, MAR07) of the standardization organization JEDEC (Joint Electron Devices Engineering Council, 2500 Wilson Blvd., Suite 220, Arlington, Va. 22201-3834, USA; www.jedec.org).

A particular advantage of devices made in this manner consists of their only taking up little space on the printed circuit board. A large placement density (number of devices per unit of area) thus results. However, a mounting of the printed circuit board with a large device density requires a high precision of the mounting process. No visual inspection is possible due to the arrangement of the connection surfaces at the lower side of the devices so that a check of the contacting has to be carried out, when required, by use of X-rays. This problem in particular relates to devices having a housing in accordance with an industrial standard according to which the respective connection surface at the lower side of the device should not extend directly up to a side edge of the lower device side, as is, for example, the case in the aforesaid JEDEC Standard MO-236.

SUMMARY OF THE INVENTION

It is an object of the invention to provide a surface-mountable electronic device which can be mounted on a printed circuit board cost-effectively with high reliability.

This object is satisfied by a device having the features of claim 1 and in particular in that at least one of the connection surfaces has a rectangular portion whose outline corresponds to a connection surface of the JEDEC Standard MO-236 or of any other standard according to which the respective connection surface should not extend directly up to a side edge of the lower device side, and in that the said at least one connection surface having a rectangular portion in accordance with the standard furthermore has an extension section which extends, starting from the rectangular portion, in the direction of a side edge of the lower side of the device.

With the device in accordance with the invention, the respective connection surface has a rectangular portion having an extension section which adjoins it and which extends in the direction of a side edge—i.e. of a boundary—of the lower side of the device. A path for the solder is hereby formed when said solder is temporarily liquefied during the solder process. The solder can thus propagate, starting from the rectangular portion, along the extension section of the connection surface up to the side edge of the lower device side and beyond this side edge to solidify in this arrangement. It is thus achieved that some of the solder projects beyond the respective side edge of the lower device side after the end of the solder process. A simple visual inspection of the solder contacts is hereby possible without the solder contacts having to be inspected in a complex and expensive manner using X-rays to ensure the desired reliability of the mounting process.

At the same time, the conformity of the device with a respective standard is ensured since the respective rectangular portion of the connection surface can, as previously, be aligned with respect to the associated contacting surface of the printed circuit board. Provision can in particular be made for the arrangement of the named rectangular portions of the connection surfaces of the device in accordance with the invention to correspond to the arrangement of the rectangular connection surfaces in accordance with a variant of the JEDEC Standard MO-236. Alternatively to the JEDEC Standard MO-236, the invention can, however, be transferred to any device standard or housing standard according to which the lower-side connection surfaces should not extend directly up to a side edge of the lower device side, but should rather be spaced apart from the side edges of the lower device side. It is important m this respect that the outline of the rectangular portion alone of the respective connection surface of the device in accordance with the invention corresponds to the outline of the complete connection surface according to the industrial standard. The device in accordance with the invention is thus compatible with this standard, whereas the additional extension sections enable an advantageous visual inspection of the solder contacts. The devices in accordance with the invention can hereby also easily be integrated into existing production lines.

This invention has a particularly advantageous application with devices whose base surface (dimension of the lower device side) has a size of 1.6 mm×1.0 mm or less. Such devices permit a particularly high placement density so that a reliable visual inspection of the solder contacts is important.

In accordance with an advantageous embodiment, the named extension section is made as a tapered section of the associated rectangular portion. In other words, the extension section forms a neck-like prolongation of the rectangular portion of the respective connection surface, i.e. the extension section is narrower than the rectangular portion. The extension section can, for example, be formed by a limb of a T-shape or of an L-shape of the connection surface. The extension section hereby takes up only a small portion of the total surface of the respective connection surface so that only a correspondingly small portion of the solder is also needed to effect the desired visible extension of the solder contact toward the associated side edge of the device. Since the width of the extension section is smaller than the corresponding extent of the rectangular portion of the connection surface, it is also ensured that the solder projecting beyond the lower side of the device does not establish any short-circuit connection to the solder of an adjacent connection surface. An improved anchorage of the connection surface in the housing of the device can above all be achieved by the formation of the extension section in the form of a tapered section of the rectangular portion to avoid delamination more effectively. This is in particular of advantage when the connection surfaces are formed by a sectionally etched lead frame which is anchored by a so-called mold process in the housing formed from grout.

These advantages are achieved in a particularly effective manner when the rectangular cross-section of the respective connection surface has an elongate shape with two longitudinal sides and two broad sides, with the named extension section adjoining one of the longitudinal sides of the rectangular portion.

It is, however, generally also possible that the named extension section forms an extension of the rectangular portion without a tapered section. In this case, the connection surface of the device in accordance with the invention is therefore rectangular overall, but larger than the named rectangular portion preset by the standard. The explained advantageous visual inspection of the solder contacts is thus possible, whereas the device in accordance with the invention is simultaneously compatible with the respective standard.

In accordance with a further advantageous embodiment, the extension section extends in a straight line between the rectangular portion of the connection surface and the respective side edge of the lower device side. A direct—and thus short—connection path is hereby established between the rectangular portion of the connection surface and the side edge of the lower device side so that it is ensured particularly reliably that the solder reaches the side edge of the lower device side in the desired manner and projects beyond it.

It is possible and can be advantageous from a technical production aspect for a specific spacing, e.g. a narrow dividing web of the housing of the device, to remain between the free end of the extension section of the respective connection surface and the associated side edge of the lower device side. However, it is preferred for the extension section to extend, starting from the rectangular portion of the connection surface, directly up to the side edge of the lower device side, i.e. when the extension section extends up to the side edge. It is namely hereby ensured in a particularly reliable manner that the solder projects beyond the lower device side to enable the desired visual inspection of the solder contact.

It is furthermore preferred in this connection for the extension section to end at the respective side edge of the lower device side without also extending along the adjacent side surface of the device. In other words, the extension section terminates flush with the side edge of the lower device side. The manufacture of the device and in particular the integration of the respective connection surface into the housing of the device are hereby simplified without an impairment of the desired visual inspection being associated therewith.

The embodiment of the connection surface having a rectangular portion and an extension section adjoining it explained above can be provided for a single connection surface of the respective device or for a plurality of—in particular all—of the connection surfaces of the device.

The invention also relates to an electronic assembly having a printed circuit board and at least one device of the kind explained above surface-mounted thereon, with the solder projecting beyond the respective side edge of the lower device side at each connection surface of the device having an extension section in order to enable a visual inspection of the solder contact.

To ensure with high reliability that the solder projects beyond the lower device side as a result of the solder process, it is preferred in this connection for the contacting surfaces of the printed circuit board not to be arranged only beneath the respective device and thus flush with the rectangular portions and extension sections of the connection surfaces of the device, but to project beyond the respective side edge of the lower device side.

BRIEF DESCRIPTION OF THE DRAWINGS

The invention will be described in the following only by way of example with reference to the drawings.

FIGS. 1a and 1b show a first embodiment of a device in accordance with the invention in a view from below or in a longitudinal sectional view along the pane Ib-Ib in accordance with FIG. 1a;

DETAILED DESCRIPTION OF THE PREFERRED EMBODIMENTS

Figure 4:
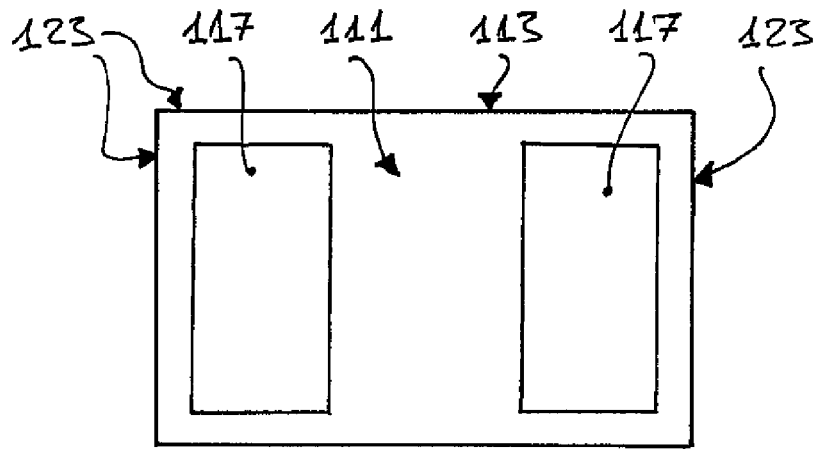
FIG. 4 shows a known device in a view from below.

FIG. 4 shows the lower side 111 of a known surface-mountable device 113 which does not have any leads. Instead, two rectangular connection surfaces 117 are provided at the lower side 111. They serve for the establishing of an electrical connection to correspondingly formed contacting surfaces of a printed circuit board (not shown in FIG. 4). The embodiment of the two connection surfaces 117 at the lower side 111 of the device 113 corresponds to an industrial standard for the housing of electronic devices and in particular to a variant of the JEDEC Standard MO-236. It must be noted that the connection surfaces 117 are substantially spaced apart from the side edges 123 of the lower device side 111.

As a result of the mounting of the device 113 on a printed circuit board, the solder is located between the contacting surfaces of the printed circuit board and the connection surfaces 117 shown in FIG. 4, that is only at the lower side 111 of the device 113. In this manner, a plurality of electronic devices can be mounted on the respective printed circuit board in a high placement density. The respective solder connection can, however, not easily be checked as to its quality. It is therefore necessary, for example, to use an examination by means of X-rays.

Figure 1A:
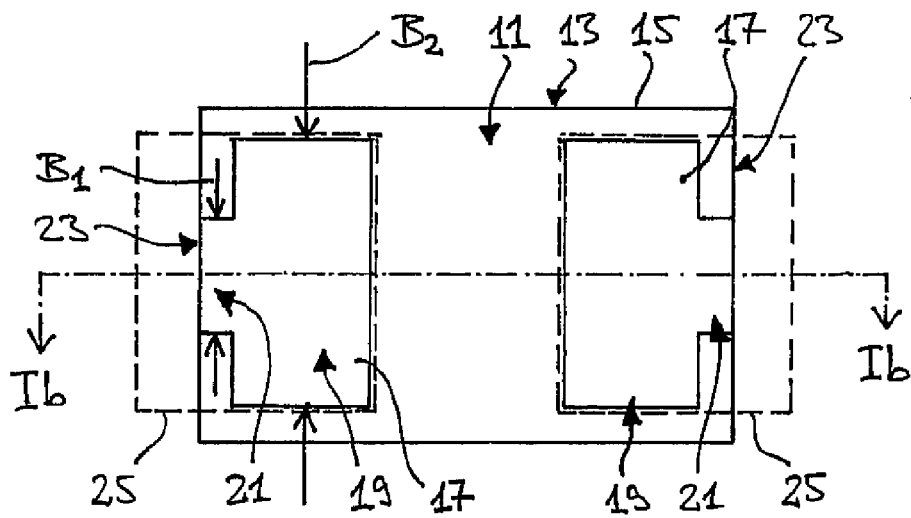

FIG. 1a shows the lower end 11 of a device 13 in accordance with the invention, which has a housing 15, in a view corresponding to the representation of FIG. 4. Two solderable connection surfaces 17 are in turn formed at the lower side 11 of the device 13 or of the housing 15. Each connection surface 17 has a rectangular portion 19 whose outline corresponds to the rectangular shape of the standard connection surfaces 117 of the known device 113 in accordance with FIG. 4. In addition, each connection surface 17 of the device 13, in accordance with the invention however, also has an extension section 21 which extends, starting from the respective rectangular portion 19, in a straight line in the direction of an adjacent side edge 23 of the lower side 11 of the device 13 or of the housing 15. The extension section 21 itself likewise has a rectangular shape. The respective extensive section 21 terminates flush with the respective side edge 23.

The respective extension section 21 is tapered with respect to the rectangular portion 19 of the respective connection surface 17. This means that the width $B_1$ of the extension section 21 is less than the width $B_2$ of the rectangular portion 19 of the connection surface 17 with respect to a direction which extends perpendicular to the direction of extent of the extension section 21 (from the rectangular portion 19 toward the side edge 23). The connection surface 17 thus substantially has a T-shape and is anchored particularly firmly in the housing 15. It would alternatively also be possible, for example, for the respective extension section 21 to form a limb of an L-shape of the connection surface 17.

The respective position of two contacting surfaces 25 to which the device 13 is fastened by soldering is furthermore shown by dashed lines in FIG. 1*a*, with an electrical connection being established at the same time. The outline of each contacting surface 25 corresponds in the region of the rectangular portion 19 to the outline of the respective connection surface 17, with the contacting surface 25, however, extending beyond the respective side edge 23 of the lower side 11 of the device 13 or of the housing 15.

Figure 1B:
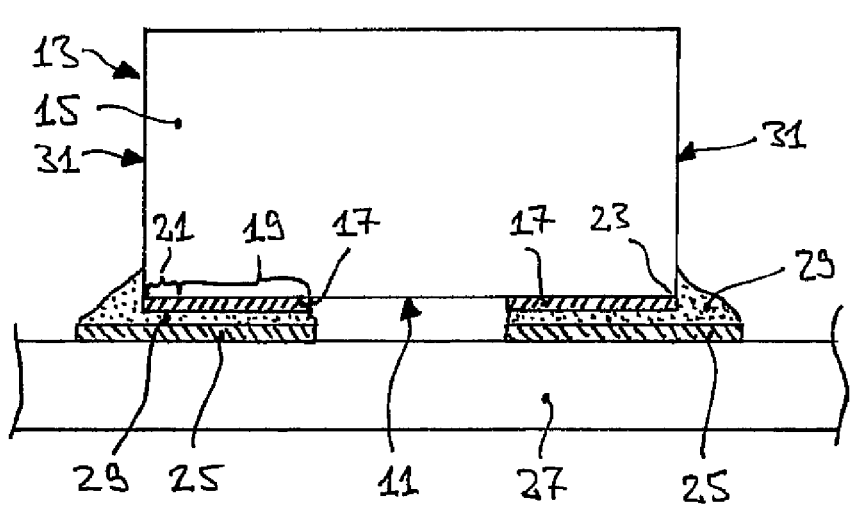

FIG. 1*b* shows the arrangement of the device 13 on a printed circuit board 27 at which the named contacting surfaces 25 are formed in the form of copper surfaces in a longitudinal sectional view. A solder 29 which simultaneously establishes a mechanical connection and an electrical connection is located between each connection surface 17 of the device 13 and the associated contacting surface 25 of the printed circuit board 27. As can be seen from FIG. 1*b*, the solder 29 extends beyond the rectangular portion 19 of the respective connection surface 17 along the extension section 21 and even protrudes beyond the respective side edge 23 of the lower device side 11.

This arrangement shown in FIG. 1*b* for the solidified state of the solder 29 results because the solder 29 can propagate in the liquefied state during the solder process along the extension section 21 of the respective connection surface 17 and can thus exit the gap which is formed between the connection surface 17 of the device 13 and the associated contacting surface 25 of the printed circuit board 27. The solder 29, in contrast, does not propagate at those regions of the lower device side 11 and of the printed circuit board 27 which are not made of metal—i.e. outside the connection surfaces 17 and the contacting surfaces 25. Depending on the amount of solder 29 used, it is at best possible that the solder 29 still wets a (lower) portion of the respective side surface 31—that is of the respective end face—of the device housing 15 which adjoins the respective side edge 23, as is shown in FIG. 1*b*.

Since therefore the solder 29 projects beyond the respective side edge 23 of the lower device side 11 at each extension section 21 of the connection surfaces 17, a visual inspection of the respective solder contact can be carried out in a simple manner—and in particular in an automated manner. It is thus, for example, not necessary to inspect the quality of the solder connection by using X-rays. A more cost-favorable and nevertheless more reliable mounting process hereby results overall.

Figure 2A:
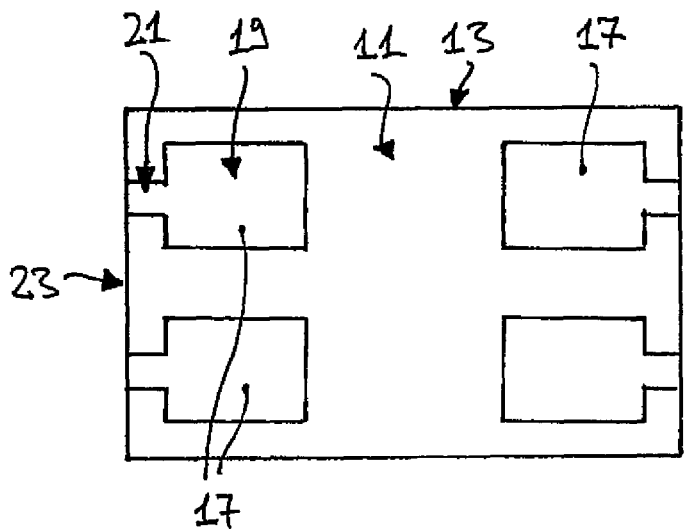
FIGS. 2a, 2b and 3 show further embodiments of a device in accordance with the invention in a respective view from below.
Figure 2B:
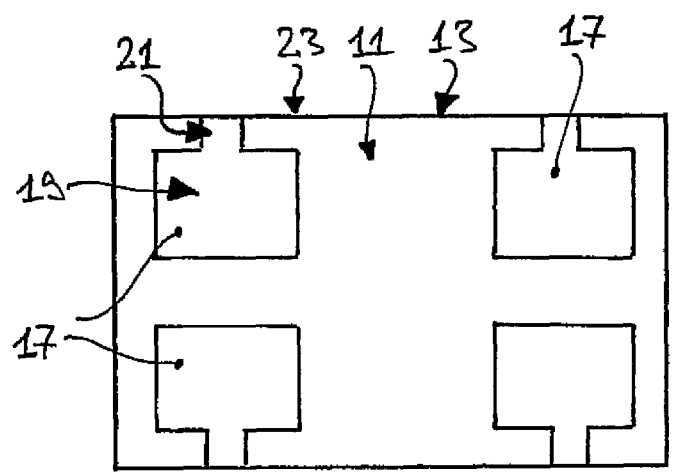

FIGS. 2*a* and 2*b* show two further embodiments of a respective electronic device 13 in accordance with the invention. In both cases, four connection surfaces 17 are provided with a respective rectangular portion 19, with the respective arrangement of the rectangular portions 19 in particular corresponding to a further variant of the JEDEC Standard MO-236. In addition to the rectangular portion 19, the connection surfaces 17 have a respective extension section 21 which establishes a connection from the rectangular portion 19 of the connection surface 17 up to the adjacent side edge 23 of the lower device side 11. In the embodiment in accordance with FIG. 2*a*, the respective extension section 21 extends, starting from a wide side of the respective rectangular portion 19, to a broad side edge 23 of the lower device side 11. In the embodiment in accordance with FIG. 2*a*, the respective extension section 21 extends, starting from a longitudinal side of the respective rectangular portion 19, in contrast to a longitudinal side edge 23 of the lower device side 11.

Figure 3:
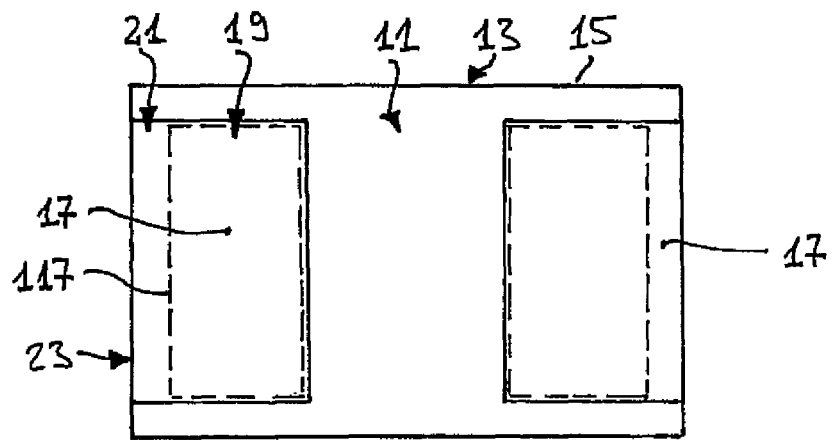

FIG. 3 shows in a view corresponding to the representation in accordance with FIGS. 1*a* and 4 the lower side 11 of a device 13 in accordance with the invention at whose lower side 11 two solderable connection surfaces 17 are formed. Each connection surface 17 has a rectangular portion 19 whose outline corresponds to the rectangular form of the connection surfaces 117 in accordance with a variant of the JEDEC Standard MO-236 (or of any other standard). The outline of the respective connection surface 117 in accordance with the standard is shown in dashed lines in FIG. 3.

In addition, each connection surface 17 of the device 13 has an extension section 21 which extends, starting from a longitudinal side of the respective rectangular portion 19, up to the adjacent side edge 23 of the lower side 11 of the device 13 and terminates flush with it, The extension section 21 itself likewise has a rectangular shape, with the width of the extension section 21 corresponding to the extent in the same direction of the rectangular portion 19. The connection surface 17 thus has a rectangular shape overall, with the connection surface 17, however, being larger than the connection surface 117 of the corresponding standard. The device 13 is nevertheless compatible with this standard.

The invention claimed is:

1. A surface-mountable electronic device free of leads which has a plurality of solderable connection surfaces at its bottom side,
   wherein each of the plurality of connection surfaces has a respective rectangular portion whose outline corresponds to a connection surface of the JEDEC Standard MO-236 according to which the respective connection surface should not extend directly up to a respective side edge of the bottom side of the device, said rectangular portion having a side which is spaced inwardly from and generally parallel to said respective side edge; wherein each of the plurality of connection surfaces furthermore has a respective extension section which extends, starting from the respective rectangular portion, in the direction of said respective side edge of the bottom side of the device, said respective extension section having a length in the direction of said respective side edge of the bottom side of the device less than the length of said side of said respective rectangular portion in the direction of said respective side edge of the bottom side of the device;

wherein said respective extension section does not protrude outwardly from said respective side edge of said bottom side of the device.

\* \* \* \* \*